(12) United States Patent
Achiriloaie et al.

(10) Patent No.: US 10,825,928 B2
(45) Date of Patent: *Nov. 3, 2020

(54) SELF-BIASING AND SELF-SEQUENCING OF DEPLETION MODE TRANSISTORS

(71) Applicant: MACOM Technology Solutions Holdings, Inc., Lowell, MA (US)

(72) Inventors: Benone Achiriloaie, Corona, CA (US); Eric Hokenson, Long Beach, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/777,473

(22) Filed: Jan. 30, 2020

(65) Prior Publication Data

US 2020/0168734 A1 May 28, 2020

Related U.S. Application Data

(63) Continuation of application No. 16/182,458, filed on Nov. 6, 2018, now Pat. No. 10,580,892, which is a (Continued)

(51) Int. Cl.
*H03K 3/01* (2006.01)
*H01L 29/78* (2006.01)
(Continued)

(52) U.S. Cl.
CPC ...... *H01L 29/7838* (2013.01); *H01L 29/2003* (2013.01); *H01L 29/866* (2013.01);
(Continued)

(58) Field of Classification Search
CPC .............. H01L 29/7838; H01L 29/866; H01L 29/2003; H03F 3/245; H03F 1/523; H03F 3/193; H03F 1/025; H03F 1/0266; H03F 2200/522; H03F 2200/75; H03F 2200/15; H03F 2200/18; H03F 2200/21;
(Continued)

(56) References Cited

U.S. PATENT DOCUMENTS 5,367,268 A * 11/1994 Baba .................... H03G 3/3036
330/129
5,892,400 A 4/1999 van Saders et al.
(Continued)

OTHER PUBLICATIONS

U.S. Appl. No. 16/355,463, dated Mar. 15, 2019, Patterson et al.
(Continued)

*Primary Examiner* — Metasebia T Retebo
(74) *Attorney, Agent, or Firm* — Thomas | Horstemeyer, LLP.; Jason M Perilla

(57) ABSTRACT

A transistor circuit includes a transistor having a gate terminal and first and second conduction terminals, a first circuit configured to convert an AC input signal of the transistor circuit to a gate bias voltage and to apply the gate bias voltage to the gate terminal of the transistor, a second circuit configured to convert the AC input signal of the transistor circuit to a control voltage, and a switching circuit configured to apply a first voltage to the first conduction terminal of the transistor in response to the control voltage.

17 Claims, 6 Drawing Sheets

Related U.S. Application Data continuation of application No. 15/250,220, filed on Aug. 29, 2016, now abandoned.

(51) Int. Cl.

| | | |
|---|---|---|
| *H03F 1/02* | (2006.01) | |
| *H03F 1/52* | (2006.01) | |
| *H03F 3/193* | (2006.01) | |
| *H03F 3/24* | (2006.01) | |
| *H01L 29/20* | (2006.01) | |
| *H01L 29/866* | (2006.01) | |

(52) U.S. Cl.
 CPC ........... *H03F 1/025* (2013.01); *H03F 1/0266* (2013.01); *H03F 1/523* (2013.01); *H03F 3/193* (2013.01); *H03F 3/245* (2013.01); *H03F 2200/12* (2013.01); *H03F 2200/15* (2013.01); *H03F 2200/18* (2013.01); *H03F 2200/21* (2013.01); *H03F 2200/222* (2013.01); *H03F 2200/27* (2013.01); *H03F 2200/297* (2013.01); *H03F 2200/387* (2013.01); *H03F 2200/42* (2013.01); *H03F 2200/451* (2013.01); *H03F 2200/471* (2013.01); *H03F 2200/48* (2013.01); *H03F 2200/519* (2013.01); *H03F 2200/522* (2013.01); *H03F 2200/555* (2013.01); *H03F 2200/75* (2013.01); *H03F 2200/99* (2013.01)

(58) Field of Classification Search
 CPC ............. H03F 2200/99; H03F 2200/48; H03F 2200/222; H03F 2200/27; H03F 2200/12; H03F 2200/297; H03F 2200/519; H03F 2200/471; H03F 2200/387; H03F 2200/42; H03F 2200/451; H03F 2200/555
 USPC ......................................................... 327/534
 See application file for complete search history.

(56) References Cited

U.S. PATENT DOCUMENTS

| | | | |
|---|---|---|---|
| 6,424,232 B1 | 7/2002 | Mavretic et al. | |
| 6,972,628 B2 * | 12/2005 | Eo | H03F 1/0266 |
| | | | 330/133 |
| 7,109,801 B2 * | 9/2006 | Li | H03F 1/301 |
| | | | 330/253 |
| 7,746,156 B1 * | 6/2010 | Massie | H03K 17/063 |
| | | | 327/421 |
| 8,026,636 B2 | 9/2011 | Oh | |
| 10,110,218 B2 | 10/2018 | Foley et al. | |
| 10,560,062 B2 | 2/2020 | Foley et al. | |
| 10,580,892 B2 * | 3/2020 | Achiriloaie | H03F 1/523 |
| 2003/0015767 A1 | 1/2003 | Emrick et al. | |
| 2003/0102912 A1 | 6/2003 | Tripathi et al. | |
| 2005/0213354 A1 | 9/2005 | Pai | |
| 2007/0004343 A1 | 1/2007 | Kandola et al. | |
| 2008/0180176 A1 * | 7/2008 | Lee | H03F 1/0261 |
| | | | 330/297 |
| 2009/0108794 A1 | 4/2009 | Ochiai et al. | |
| 2010/0073088 A1 | 3/2010 | Wimpenny et al. | |
| 2011/0006846 A1 * | 1/2011 | Miho | H03F 1/0266 |
| | | | 330/278 |
| 2011/0050036 A1 | 3/2011 | Gilardi | |
| 2011/0181324 A1 | 7/2011 | Gesche et al. | |
| 2011/0279185 A1 * | 11/2011 | Lautzenhiser | H03F 1/301 |
| | | | 330/296 |
| 2013/0121044 A1 | 5/2013 | Gao et al. | |
| 2013/0207726 A1 | 8/2013 | Tadano | |
| 2014/0184334 A1 | 7/2014 | Nobbe et al. | |
| 2015/0188496 A1 * | 7/2015 | Kim | H03F 1/0266 |
| | | | 330/296 |
| 2016/0134967 A1 | 5/2016 | Kwon | |
| 2018/0061984 A1 | 3/2018 | Achiriloaie et al. | |
| 2018/0145680 A1 | 5/2018 | Foley et al. | |
| 2018/0145681 A1 | 5/2018 | Foley et al. | |
| 2018/0145682 A1 | 5/2018 | Foley et al. | |
| 2018/0358886 A1 | 12/2018 | Patterson et al. | |
| 2019/0245085 A1 | 8/2019 | Achiriloaie et al. | |

OTHER PUBLICATIONS

PCT/US2017/048621, dated Nov. 30, 2017, International Search Report and Written Opinion.
PCT/US2017/048621, dated Aug. 6, 2018, Written Opinion of the International Preliminary Examining Authority.
PCT/US2017/048621, dated Nov. 14, 2018, Written Opinion of the International Preliminary Examining Authority.
PCT/US2017/048621, dated Dec. 19, 2018, Ch. II International Preliminary Report on Patentability.
U.S. Appl. No. 16/355,463, Patterson et al., dated Mar. 15, 2019.
International Search Report and Written Opinion for Application No. PCT/US2017/048621 dated Nov. 30, 2017.
Written Opinion of the International Preliminary Examining Authority for International Application No. PCT/US2017/048621, dated Aug. 6, 2018.
Written Opinion of the International Preliminary Examining Authority for International Application No. PCT/US2017/048621, dated Nov. 14, 2018.
Ch. II International Preliminary Report on Patentability for International Application No. PCT/US2017/048621, dated Dec. 19, 2018
TPS6513x Positive and Negative Output DC-DC Converter. Texas Instruments. Jan. 2016. 33 pages.
M09000-14: LED Driver and PMIC for DLP/LCOS Pico Projectors. MACOM Technology Solutions, Inc. Publicly known prior to Nov. 18, 2016. 56 pages.

* cited by examiner

US 10,825,928 B2

SELF-BIASING AND SELF-SEQUENCING OF DEPLETION MODE TRANSISTORS

Related Applications

This Application is a Continuation of U.S. application Ser. No. 16/182,458, filed Nov. 6, 2018, which is a Continuation of U.S. application Ser. No. 15/250,220, filed Aug. 29, 2016, each of which applications is incorporated herein by reference in its entirety.

BACKGROUND

Technical Field

The disclosed technology relates to self-biasing of transistors and, more particularly, to self-biasing of depletion mode gallium nitride power transistors.

Discussion of Related Art

Gallium nitride transistors are used for radio frequency power amplifiers because they can operate at high temperatures and high voltages. High power gallium nitride transistors are typically depletion mode devices, which are normally on at zero gate-source voltage. If a voltage is applied between the drain and the source when the gate-source voltage is zero, a large, potentially destructive current may flow through the device. Accordingly, a negative gate bias voltage is applied to the transistor before a voltage is applied between the drain and the source, in order to limit current flow when the drain voltage is applied. This implies sequencing of the voltages used to operate depletion mode transistors.

A typical depletion mode transistor circuit is provided with a drain supply voltage, a negative gate bias voltage and a triggering signal which enables or disables the gate bias, the drain supply voltage, or both. An RF input signal is supplied to the gate of the transistor, and an amplified RF output signal is obtained at the output of the circuit.

The negative gate bias voltage typically requires use of a DC-DC converter to convert a positive supply voltage to the negative gate bias voltage. The DC-DC converter involves extra cost and extra circuit area. In addition, DC-DC converters can generate unwanted RF noise, which is problematic in transmitter and receiver systems. Also, if a negative voltage source is present in the system, a line has to be routed from the voltage source to the gate of the transistor, making the system susceptible to noise.

Another disadvantage of depletion mode transistors is the requirement for the sequencing of the gate and drain voltages. The negative voltage must be present at the gate before the drain voltage is applied. The channel of the depletion mode transistor is fully open with a floating or grounded gate, and application of a drain voltage in this state may permanently damage the device.

Accordingly, there is a need for improved transistor biasing circuits.

SUMMARY

The disclosed technology provides circuitry which uses an AC input signal, such as an RF input signal, to generate a gate bias voltage and to apply a drain voltage to the transistor. The disclosed technology eliminates the need for a separate voltage source for the gate or a DC-DC converter. Because generating the gate bias voltage and switching the drain voltage are based on the input signal, sequencing of the gate bias voltage and the drain voltage can be achieved by selecting the time constants of the circuitry.

In accordance with embodiments, a transistor circuit comprises a transistor having a gate terminal and first and second conduction terminals, a first circuit configured to convert an AC input signal of the transistor circuit to a gate bias voltage and to apply the gate bias voltage to the gate terminal of the transistor, a second circuit configured to convert the input signal of the transistor circuit to a control voltage, and a switching circuit configured to apply a first voltage to the first conduction terminal of the transistor in response to the control voltage.

In some embodiments, the first and second circuits and the switching circuit are configured to apply the gate bias voltage to the gate terminal of the transistor before the first voltage is applied to the first conduction terminal of the transistor.

In some embodiments, the transistor comprises a depletion mode transistor. In further embodiments, the transistor comprises a gallium nitride depletion mode power transistor.

In some embodiments, the gate bias voltage is negative and the first voltage is a positive drain voltage.

In some embodiments, the first circuit comprises an RF coupler, a rectifier and a voltage regulator.

In some embodiments, the second circuit comprises an RF coupler and a rectifier.

In accordance with embodiments, a method is provided for operating a transistor having a gate terminal and first and second conduction terminals. The method comprises converting an AC input signal to a gate bias voltage and applying the gate bias voltage to the gate terminal of the transistor, converting the AC input signal to a control voltage, and applying a first voltage to the first conduction terminal of the transistor in response to the control voltage.

In accordance with embodiments, a transistor circuit comprises a depletion mode RF power transistor having a gate terminal, a drain terminal and a source terminal, a first circuit configured to convert an input RF signal to a gate bias voltage and to apply the gate bias voltage to the gate terminal of the transistor, a second circuit configured to convert the RF input signal to a control voltage, and a switching circuit configured to apply a drain voltage to the drain terminal of the transistor in response to the control voltage, wherein the first and second circuits and the switching circuit are configured to apply the gate bias voltage to the gate terminal of the transistor before the drain voltage is applied to the drain terminal of the transistor.

BRIEF DESCRIPTION OF DRAWINGS

The disclosed technology may be understood with reference to the accompanying drawings, which are incorporated herein by reference and in which.

DETAILED DESCRIPTION

Figure 1:
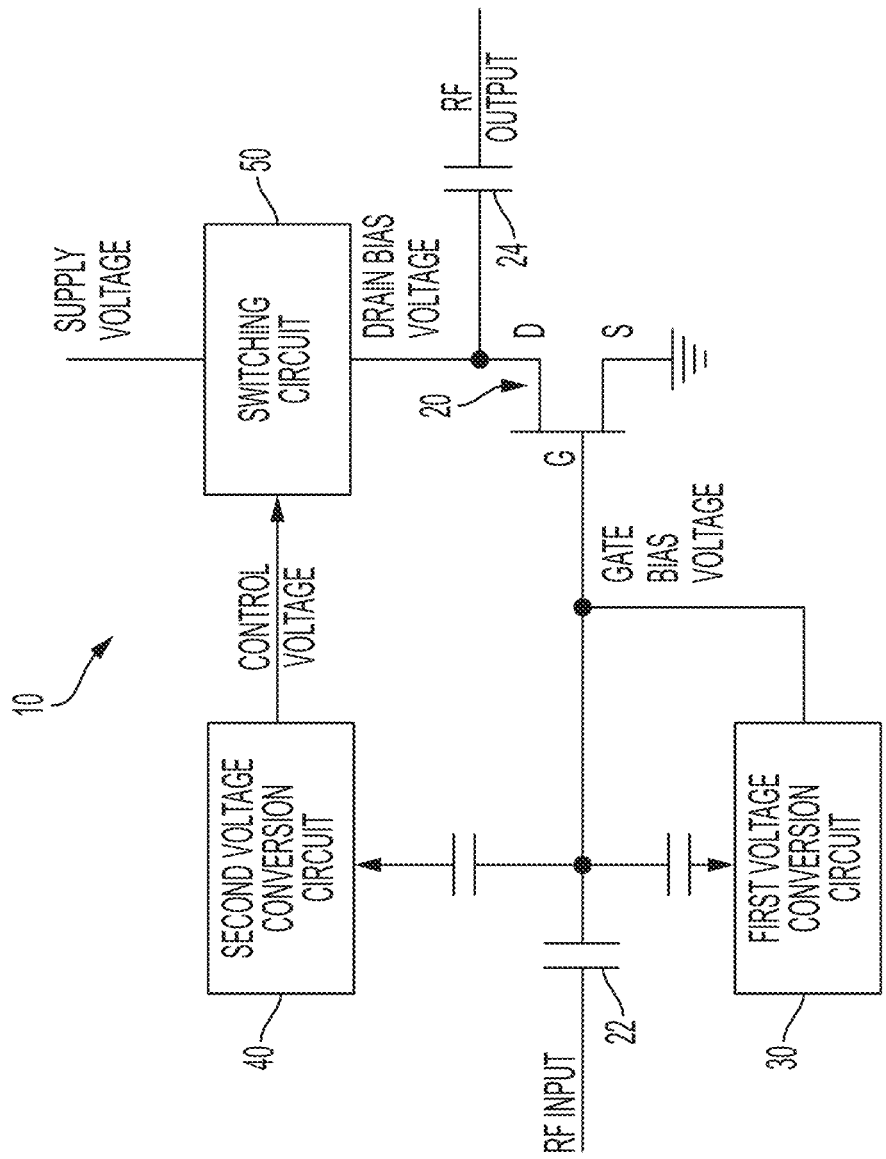
FIG. 1 is a schematic block diagram of a transistor circuit in accordance with embodiments.

A schematic block diagram of a transistor circuit 10 in accordance with embodiments is shown in FIG. 1. The transistor circuit 10 includes a transistor 20 which receives an AC input signal, which may be an RF input signal, through a DC blocking capacitor 22 and provides an RF output signal through a DC blocking capacitor 24. The transistor 20 includes a gate terminal G, a drain terminal D and a source terminal S and may, for example, be a gallium nitride RF power transistor which operates in the depletion mode. A depletion mode transistor is one which is normally on at zero gate-source voltage with a drain voltage applied. In contrast, an enhancement mode transistor is normally off at zero gate-source voltage with a drain voltage applied. The transistor 20 is not limited to a gallium nitride transistor and is not limited to a depletion mode transistor. The drain and source terminals may be referred to as first and second conduction terminals.

The transistor 20 receives the RF input signal at the gate terminal G and provides the RF output signal at the drain terminal D. The source terminal S of transistor 20 may be connected to a reference voltage, such as ground. The transistor circuit 10 further includes a first voltage conversion circuit 30, a second voltage conversion circuit 40 and a switching circuit 50.

The first voltage conversion circuit 30 has an input coupled to the RF input of the transistor circuit 10 and an output coupled to the gate terminal G of transistor 20. The first voltage conversion circuit 30 samples the RF input signal and provides a gate bias voltage to the gate terminal G of transistor 20.

The second voltage conversion circuit 40 has an input coupled to the RF input of the transistor circuit 10 and an output coupled to a control input of switching circuit 50. The second voltage conversion circuit 40 samples the RF input signal and provides a control voltage to switching circuit 50.

The switching circuit 50 is coupled between a supply voltage and the drain terminal D of transistor 20 and receives the control voltage from the output of second voltage conversion circuit 40. When the control voltage is inactive, in the absence of an RF input signal, the switching circuit 50 is turned off and the supply voltage is disconnected from the drain terminal D of transistor 20. When the control voltage is active, in the presence of an RF input signal, the switching circuit 50 is turned on, and the supply voltage is applied to the drain terminal D of transistor 20.

Operation of the transistor circuit 10 shown in FIG. 1 depends on the state of the RF input signal. When the RF input signal is off, the first voltage conversion circuit 30, the second voltage conversion circuit 40 and the switching circuit 40 and the switching circuit 50 are deactivated. As a result, the gate bias voltage applied to gate terminal G is zero, and the switching circuit 50 is turned off, so that the supply voltage is not applied to the drain terminal D of transistor 20. Thus, transistor 20 is in an off state.

Figure 2:
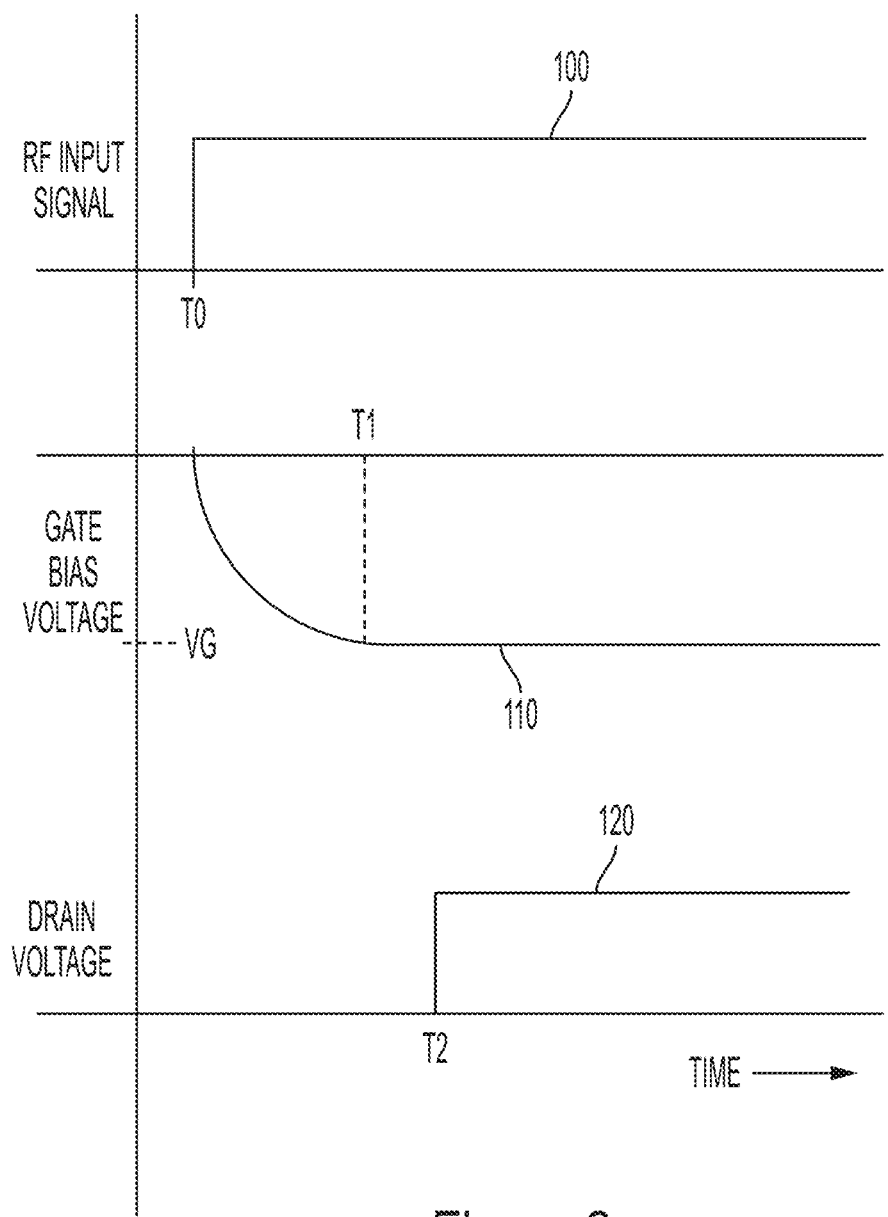
FIG. 2 is a timing diagram that illustrates sequencing of the gate bias voltage and the drain voltage.

Operation of transistor circuit 10 is described with reference to FIG. 2. In FIG. 2, RF input signal 100, gate bias voltage 110 and drain voltage 120 are plotted as a function of time. Initially, the RF input signal is zero, the gate bias voltage applied to gate terminal G is zero and the drain voltage applied to drain terminal D is zero. At a time T0, the RF input signal is applied to the input of the transistor circuit 10. At time T0, the gate bias voltage begins decreasing, and the drain voltage applied to drain terminal D remains at zero volts. The gate bias voltage decreases in response to sampling of the RF input signal as described below. At a time T1, the gate bias voltage reaches a sufficient negative value −VG for biasing of transistor 20 in an off or partially off state. The drain voltage applied to drain terminal D remains at zero at time T1. At a time T2 later than time T1, the second voltage conversion circuit 40 applies the control voltage to switching circuit 50. The switching circuit 50 applies the supply voltage to drain terminal D of transistor 20 in response to the control voltage.

FIG. 2 illustrates sequencing of the gate bias voltage and the drain voltage. The gate bias voltage 110 is applied to the gate terminal G of transistor 20 at time T1 before the drain voltage 120 is applied to drain terminal D of transistor 20 at time T2. Thus, the transistor 20 is biased off before the drain voltage 120 is applied to the drain terminal, and damage to transistor 20 is prevented.

The sequencing illustrated in FIG. 2 and described above may be provided by the first voltage conversion circuit 30, the second voltage conversion circuit 40 and/or the switching circuit 50, since application of the gate bias voltage 110 and switching of the drain supply voltage 120 are both initiated by the RF input signal. For example, the second voltage conversion circuit 40 may have a time constant that is longer than a time constant of the first voltage conversion circuit 30 to ensure that the gate bias voltage is applied to the gate terminal G of transistor 20 before the control voltage is applied to switching circuit 50. The delay between time T1 and time T2 should be sufficient to ensure that transistor 20 is biased off or partially off and is not damaged by the application of the supply voltage to the drain terminal D of transistor 20.

In the example of FIG. 2, the gate bias voltage is negative, and the supply voltage applied to the drain terminal D of transistor 20 is positive. However, the gate bias voltage can be positive or negative, and the drain supply voltage can be positive or negative, depending on the transistor type and the circuit configuration. Further, the transistor 20 has been described as a depletion mode transistor. However, the transistor circuit 10 may be utilized with an enhancement mode transistor. In the case of an enhancement mode transistor, sequencing of the voltages applied to the transistor may not be necessary.

Figure 3:
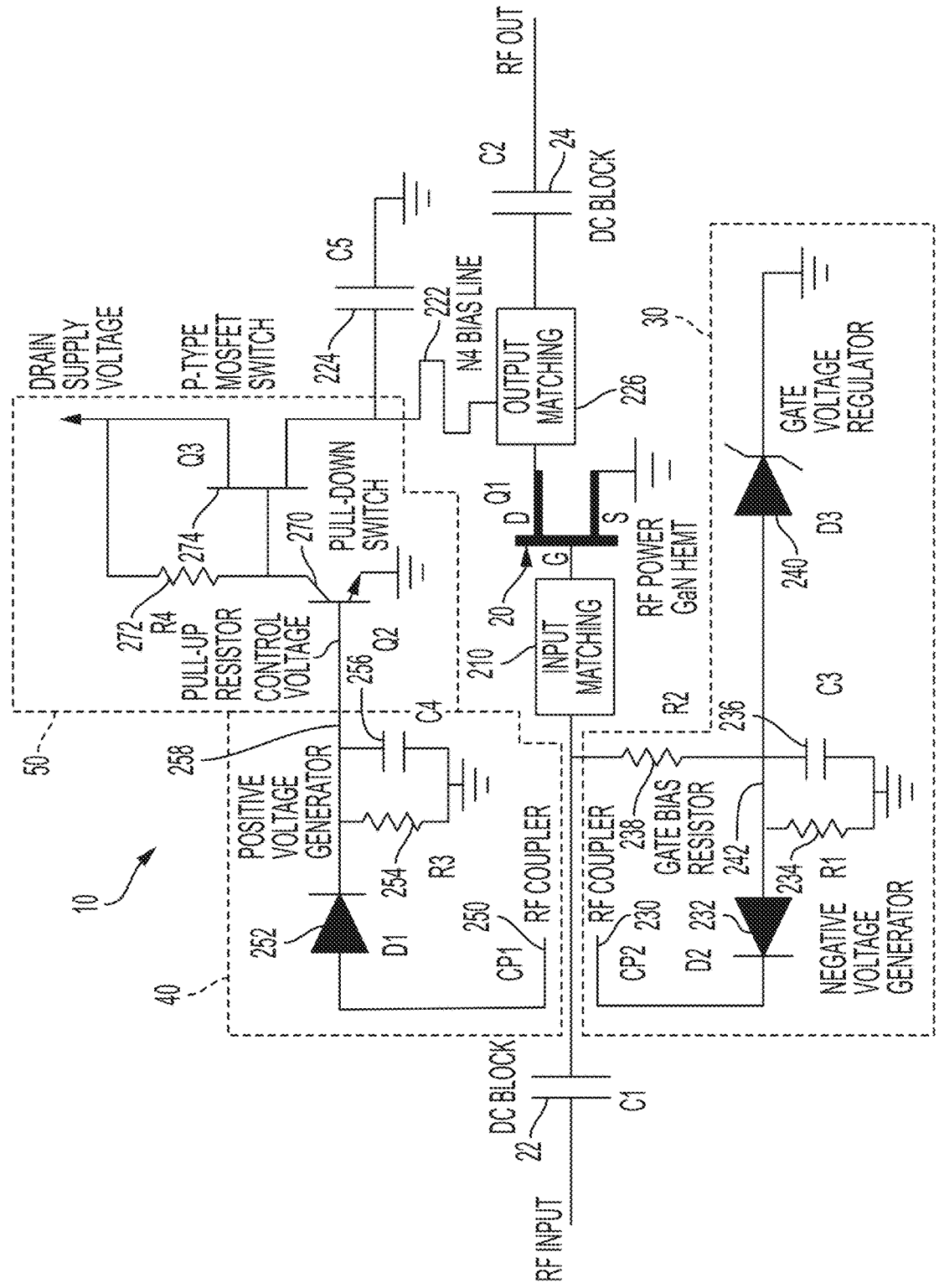
FIG. 3 is a schematic diagram of a transistor circuit in accordance with embodiments.

An embodiment of the transistor circuit 10 of FIG. 1 is shown in FIG. 3. Like elements in FIGS. 1 and 3 have the same reference numerals. In the embodiment of FIG. 3, the transistor 20 is an RF power GaN (gallium nitride) HEMT (high electron mobility transistor) and is a depletion mode transistor. A negative voltage generator corresponds to the first voltage conversion circuit 30 of FIG. 1, and a positive voltage generator corresponds to the second voltage conversion circuit 40 of FIG. 1.

The transistor circuit 10 of FIG. 3 includes an input matching circuit 210 coupled between DC blocking capacitor 22 and the gate terminal G of transistor 20 and an output matching circuit 220 coupled between the drain terminal D of transistor 20 and DC blocking capacitor 24. A quarter wavelength bias line 222 is coupled between output matching circuit 220 and switching circuit 50. A capacitor 224 is coupled between quarter wavelength bias line 222 and ground.

In the embodiment of FIG. 3, the first voltage conversion circuit 30 includes an RF coupler 230, a diode 232, a resistor 234, a capacitor 236, a resistor 238, and a gate voltage regulator 240. The RF coupler 230 samples the RF input signal and can be a directional coupler in stripline or microstrip, for example. RF coupler 230 is coupled through diode 232 to a node 242. Diode 232 functions as a rectifier of the sampled RF input signal. Resistor 234 and capacitor 236 are connected in parallel between node 242 and ground. Resistor 238 is coupled between node 242 and the gate terminal G of transistor 20 via input matching circuit 210. The gate voltage regulator 240, which may be for example a Zener diode, is coupled between node 242 and ground.

In operation, the RF coupler 230 samples the RF input signal, and the diode 232 rectifies the sampled RF input signal. The rectified RF input signal produces a negative voltage on node 242. The resistor 234 and the capacitor 236 perform smoothing of the rectified voltage, and the gate voltage regulator 240 establishes a fixed voltage on node 242. The voltage on node 242 is coupled through resistor 238 to the gate terminal G to provide a negative gate bias voltage in the embodiment of FIG. 3.

The second voltage conversion circuit 40 includes an RF coupler 250, a diode 252, a resistor 254 and a capacitor 256. The diode 252 is connected between RF coupler 250 and a node 258. Diode 252 functions as a rectifier of the sampled RF input signal. The resistor 254 and the capacitor 256 are connected in parallel between the node 258 and ground.

In operation, the RF coupler 250 samples the RF input signal, and the diode 252 rectifies the sampled RF input signal. The resistor 254 and the capacitor 256 smooth the rectified voltage to produce a positive control voltage on node 258. The control voltage on node 258 is supplied to switching circuit 50 so as to control a switch state of switching circuit 50. The control voltage on node 258 has a sufficient magnitude to activate the switching circuit 50 to an on switch state.

In the embodiment of FIG. 3, the switching circuit 50 includes a transistor 270, a resistor 272 and a transistor 274. In the embodiment of FIG. 3, transistor 270 is a bipolar transistor, and transistor 274 is a P-type MOSFET switch. The transistor 270 has a base which receives a control voltage from second voltage conversion circuit 40, a collector connected to a gate of transistor 274 and an emitter connected to ground. The resistor 272 is connected between the gate of transistor 274 and the drain supply voltage. The drain of transistor 274 is connected to the drain supply voltage, and the source of transistor 274 is connected via bias line 222 and output matching circuit 220 to the drain terminal D of transistor 20.

In operation, the control voltage supplied to the base of transistor 270 is at ground in the absence of an RF input signal, and the gate of transistor 274 is pulled to the drain supply voltage by resistor 272. As a result, transistor 274 is off and the drain supply voltage is not applied to the drain terminal D. When an RF input signal is received, a control voltage is produced on node 258 by the second voltage conversion circuit 40, and transistor 270 is turned on. The gate of transistor 274 is pulled to ground, and transistor 274 is turned on, thereby applying the drain supply voltage to the drain terminal D of transistor 20.

As discussed above in connection with FIG. 2, the gate bias voltage and the drain supply voltage are sequenced such that the gate bias voltage is applied to the gate of transistor 20 before the drain supply voltage is applied to the drain terminal D of transistor 20. The sequencing can be accomplished in the embodiment of FIG. 3 by appropriate choices of the components of the first voltage conversion circuit 30, the second voltage conversion circuit 40 and the switching circuit 50. In particular, the resistor 234 and the capacitor 236 establish a time constant of the first voltage conversion circuit 30, and the resistor 254 and the capacitor 256 establish a time constant of the second voltage conversion circuit 40. The sequencing of the voltages may be based on the difference between the time constants of the first voltage conversion circuit 30 and the second voltage conversion circuit 40. Thus, the values of the resistors and capacitors may be selected such that the time constant of first voltage conversion circuit 30 is less than the time constant of second voltage conversion circuit 40. In the embodiment of FIG. 3, it is assumed that switching circuit 50 has a delay which is short in comparison with the time constants of the first voltage conversion circuit 30 and the second voltage conversion circuit 40. However, this is not a limitation and the switching circuit 50 can have a selected delay.

Figure 4:
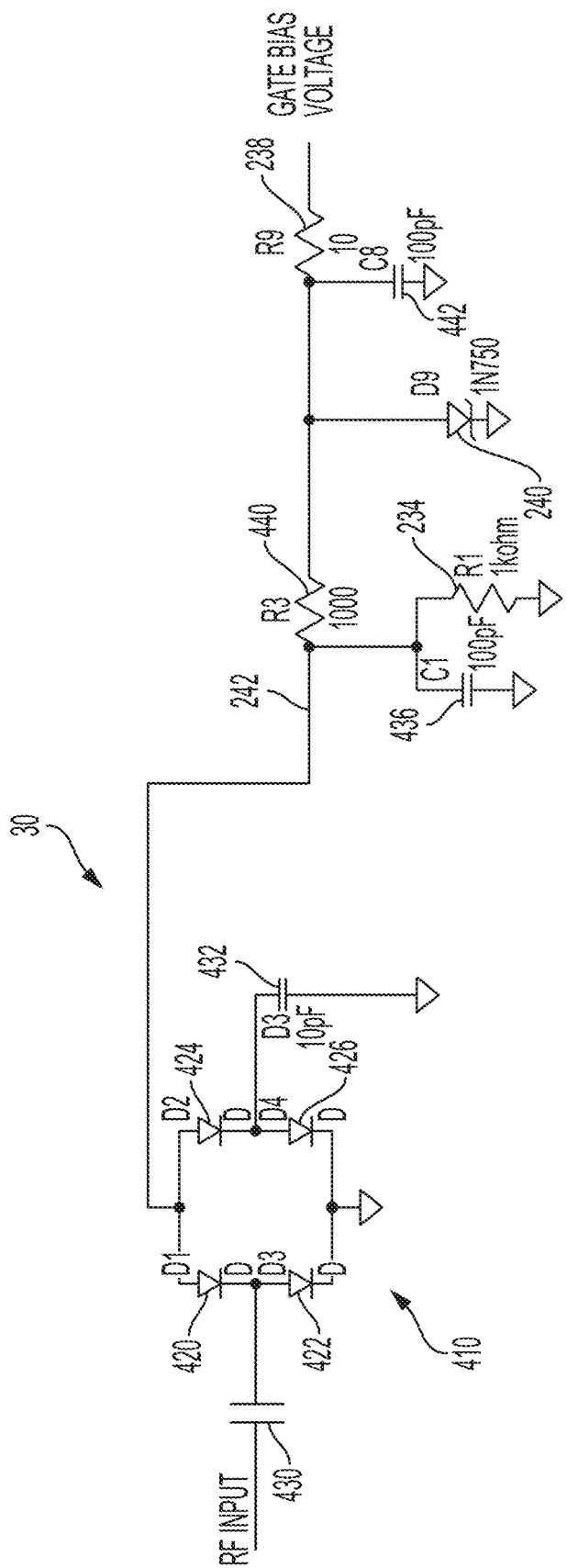
FIG. 4 is a schematic diagram of the first voltage conversion circuit in accordance with embodiments.

A schematic diagram of an implementation of first voltage conversion circuit 30 in accordance with embodiments is shown in FIG. 4. Like elements in FIGS. 3 and 4 have the same reference numerals and their descriptions will not be repeated.

The implementation of FIG. 4 includes a four diode full-bridge rectifier 410 rather than the single diode 232 of FIG. 3. The full-bridge rectifier 410 includes diodes 420, 422, 424 and 426 in a bridge configuration. The input RF signal is connected through a DC blocking capacitor 430 to the node between diodes 420 and 422, and the node between diodes 424 and 426 is connected through a capacitor 432 to ground. The node between diodes 422 and 426 is connected to ground. The node between diodes 420 and 424 (node 242) is connected to resistor 234 and capacitor 236. A resistor 440 is connected between node 242 and gate voltage regulator 240, and a capacitor 442 is connected in parallel with gate voltage regulator 240. The first voltage conversion circuit 30 of FIG. 4 operates substantially as described above in connection with FIG. 3, with improved performance provided at least in part by the use of full-bridge rectifier 410.

Figure 5:
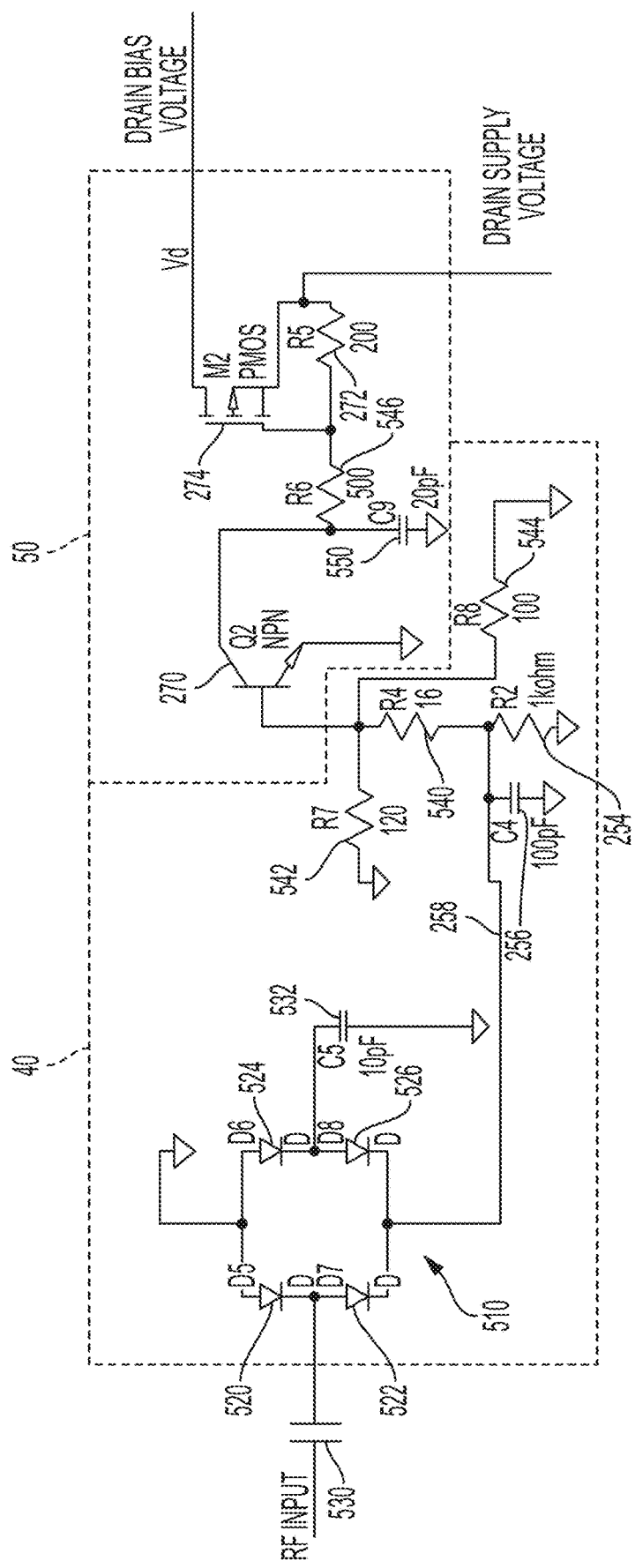
FIG. 5 is a schematic diagram of the second voltage conversion circuit and the switching circuit in accordance with embodiments.

A schematic diagram of an implementation of second voltage conversion circuit 40 and switching circuit 50 in accordance with embodiments is shown in FIG. 5. Like elements in FIGS. 3 and 5 have the same reference numerals and their descriptions will not be repeated.

The second voltage conversion circuit 40 of FIG. 5 includes a four diode full-bridge rectifier 510 in place of single diode 252 of FIG. 3. The full-bridge rectifier 510 includes diodes 520, 522, 524 and 526 connected in a full-bridge configuration. The RF input is coupled through a DC blocking capacitor 530 to the node between diodes 520 and 522. The node between diodes 524 and 526 is connected through a capacitor 532 to ground. The node between diodes 522 and 526 is connected to ground. The node between diodes 522 and 526 (node 258) is connected to resistor 254 and capacitor 256. Node 258 is connected through a resistor 540 to the base of transistor 270, and resistors 542 and 544 are connected between the base of transistor 270 and ground. The collector of transistor 270 is connected through a resistor 546 to the gate of transistor 274. A capacitor 550 is connected between the collector of transistor 270 and ground. The circuit of FIG. 5 operates substantially as described above in connection with FIG. 3, with improved performance provided at least in part by the use of full-bridge rectifier 510.

Figure 6:
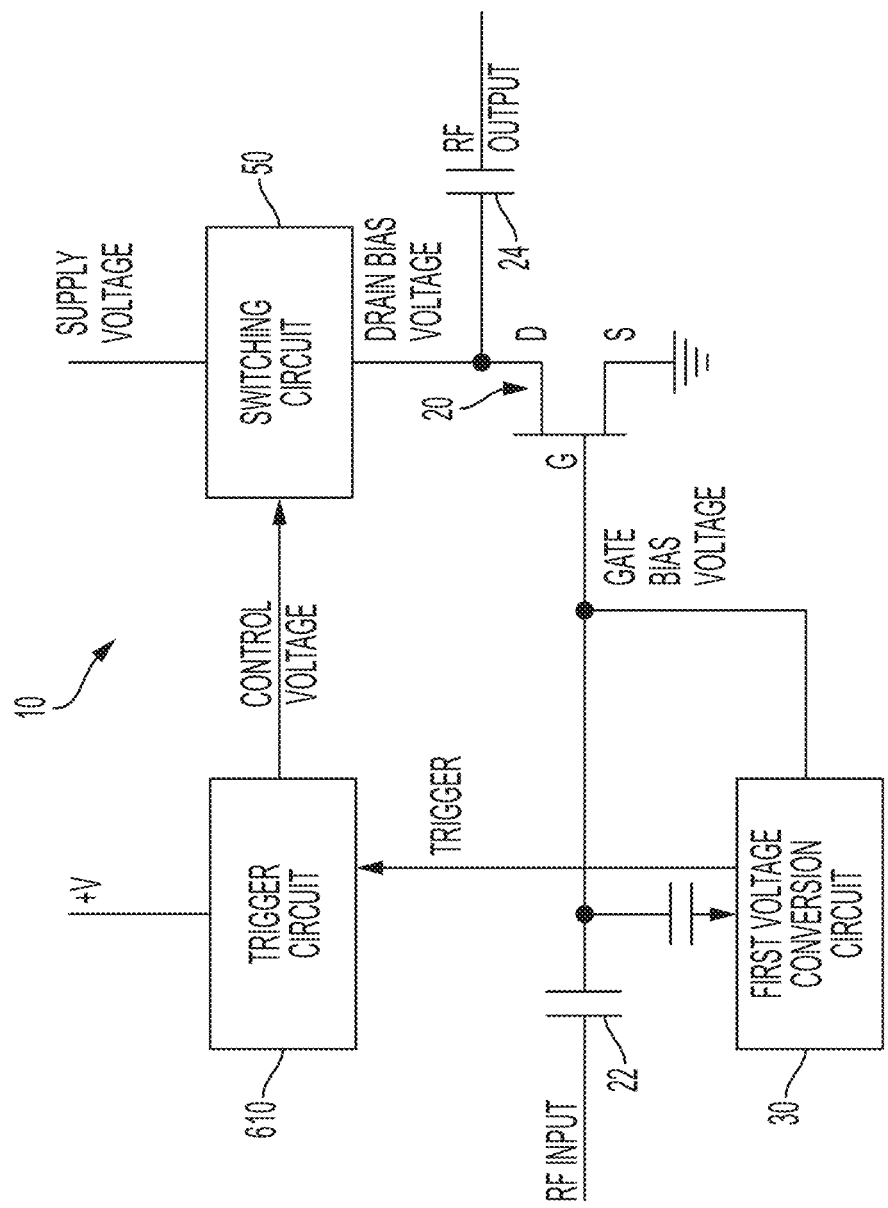
FIG. 6 is a schematic block diagram of a transistor circuit in accordance with further embodiments.

A schematic diagram of transistor circuit 10 in accordance with further embodiments is shown in FIG. 6. Like elements in FIGS. 1 and 6 have the same reference numerals, and their descriptions will not be repeated.

In the embodiment of FIG. 6, the second voltage conversion circuit shown in FIG. 1 is replaced with a trigger circuit 610. The trigger circuit 610 receives a trigger input from the first voltage conversion circuit 30 and does not receive the RF input signal. The trigger input can be taken from node 242 (FIG. 3) of first voltage conversion circuit 30, for example. The trigger input indicates the presence of an RF input as detected by first voltage conversion circuit 30. The trigger circuit 610 causes the control voltage to be applied to switching circuit 50 after a delay with respect to the gate bias voltage. The trigger circuit 610 may include a delay circuit, such as an RC circuit, to delay application of the control voltage to switching circuit 50 with respect to the application of gate bias voltage to transistor 20. In other embodiments, the switching circuit 50 may include a delay circuit to delay the application of the supply voltage to the drain of transistor 20, and/or the trigger input itself may be delayed by the first voltage conversion circuit. The transistor circuit 10 of FIG. 6 has an advantage that a single RF coupler can be utilized such that RF coupler 250 shown in FIG. 3 is not required.

A variety of implementations are included within the disclosed technology. For example, the RF couplers 230 and 250 can be implemented as directional couplers in stripline or microstrip, transfomers, resistors, capacitors, etc. The diode rectifiers in first voltage conversion circuit 30 and in second voltage conversion circuit 40 may be implemented as a single diode, as a two diode half-bridge rectifier or as a four diode full-bridge rectifier. In each case, the RF input signal is sampled, rectified and smoothed. The transistor 274 which switches the drain supply voltage can be any type of solid state switch, such as an N-type MOSFET, NPN or PNP bipolar transistors, GaN, GaAs switching transistors, or the like. As indicated above, the self-biasing disclosed herein can be applied to enhancement mode devices by appropriate change of voltages. Further, the transistor circuit described herein can be implemented as a discrete component, a chip-and-wire circuit on a substrate inside the package of the transistor 20, or can be monolithically fabricated on the same die as transistor 20.

The transistor circuit described herein may be utilized, for example, in an RF transmitter. However, this is not a limitation. Further, the RF input signal, which may be in a range of kilohertz to tens of gigahertz, may be relatively narrow band. Again, this is not a limitation. In addition, the RF input signal may have a substantially constant power level, except when turned off. Once again, this is not a limitation provided that the RF input signal level is sufficient to generate a gate bias voltage and a control voltage.

Having thus described several aspects of several embodiments of this invention, it is to be appreciated that various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A transistor circuit comprising:
   a transistor comprising a gate terminal and first and second conduction terminals;
   a first circuit configured to convert an AC input signal of the transistor circuit to a gate bias voltage and to apply the gate bias voltage to the gate terminal of the transistor, the first circuit comprising an RF signal sampling device, an AC to DC signal converter, and a voltage conditioning regulating device;
   a second circuit configured to convert the AC input signal of the transistor circuit to a control voltage; and
   a switching circuit configured to apply a first voltage to the first conduction terminal of the transistor in response to the control voltage, wherein the first circuit, the second circuit, and the switching circuit are configured to apply the gate bias voltage to the gate terminal of the transistor before the first voltage is applied to the first conduction terminal of the transistor.

2. The transistor circuit as defined in claim 1, wherein the transistor comprises a depletion mode transistor.

3. The transistor circuit as defined in claim 2, wherein the gate bias voltage is negative and the first voltage is positive.

4. The transistor circuit as defined in claim 1, wherein the first circuit further comprises a diode rectifier.

5. The transistor circuit as defined in claim 4, wherein the diode rectifier comprises a half bridge rectifier.

6. The transistor circuit as defined in claim 4, wherein the diode rectifier comprises a full bridge rectifier.

7. The transistor circuit as defined in claim 1, wherein the voltage conditioning regulating device comprises a Zener diode.

8. The transistor circuit as defined in claim 1, wherein the RF signal sampling device comprises a directional coupler.

9. The transistor circuit as defined in claim 1, wherein the second circuit comprises an RF coupler and a rectifier.

10. The transistor circuit as defined in claim 1, wherein the transistor comprises a gallium nitride depletion mode power transistor.

11. The transistor circuit as defined in claim 1, wherein the AC to DC signal converter comprises a resistor and a capacitor coupled in parallel with the resistor.

12. A method for operating a transistor having a gate terminal and first and second conduction terminals, comprising:
   converting an AC input signal to a gate bias voltage and applying the gate bias voltage to the gate terminal of the transistor using a first circuit comprising an RF signal sampling device, an AC to DC signal converter, and a voltage conditioning regulating device;
   converting the AC input signal to a control voltage; and
   after applying the gate bias voltage to the gate terminal of the transistor, applying a first voltage to the first conduction terminal of the transistor in response to the control voltage.

13. The method as defined in claim 12, wherein the transistor comprises a gallium nitride depletion mode power transistor, wherein the gate bias voltage applied to the gate terminal of the transistor is negative and wherein the first voltage applied to the first conduction terminal of the transistor is positive.

14. A transistor circuit comprising:
   a depletion mode RF power transistor comprising a gate terminal, a drain terminal and a source terminal;
   a first circuit configured to convert an input RF signal to a gate bias voltage and to apply the gate bias voltage to the gate terminal of the transistor, the first circuit comprising an RF signal sampling device, an AC to DC signal converter, and a voltage conditioning regulating device;
   a second circuit configured to convert the RF input signal to a control voltage; and
   a switching circuit configured to apply a drain voltage to the drain terminal of the transistor in response to the control voltage, wherein the first and second circuits and the switching circuit are configured to apply the gate bias voltage to the gate terminal of the transistor before the drain voltage is applied to the drain terminal of the transistor.

15. The transistor circuit as defined in claim 14, wherein the gate bias voltage is negative and the drain voltage is positive.

16. The transistor circuit as defined in claim 14, wherein the second circuit comprises an RF coupler and a rectifier.

17. The transistor circuit as defined in claim 14, wherein the AC to DC signal converter comprises a rectifier, a resistor, and a capacitor, and the resistor and the capacitor smooth a rectified voltage output by the rectifier.

* * * * *